(12) United States Patent
Kigure (10) Patent No.: US 10,132,826 B2
(45) Date of Patent: Nov. 20, 2018

(54) PHYSICAL QUANTITY SENSOR, PHYSICAL QUANTITY SENSOR DEVICE, ELECTRONIC APPARATUS, AND MOVING OBJECT

(71) Applicant: Seiko Epson Corporation, Tokyo (JP)

(72) Inventor: Shota Kigure, Takasaki (JP)

(73) Assignee: Seiko Epson Corporation (JP)

( * ) Notice: Subject to any disclaimer, the term of this patent is extended or adjusted under 35 U.S.C. 154(b) by 192 days.

(21) Appl. No.: 15/195,009

(22) Filed: Jun. 28, 2016

(65) Prior Publication Data
US 2017/0010299 A1    Jan. 12, 2017

(30) Foreign Application Priority Data

Jul. 10, 2015 (JP) ................. 2015-138475

(51) Int. Cl.
  *G01P 15/125* (2006.01)
  *G01P 15/08* (2006.01)
(52) U.S. Cl.
  CPC .... *G01P 15/125* (2013.01); *B81B 2201/0235* (2013.01); *B81B 2203/051* (2013.01); *G01P 2015/0814* (2013.01)
(58) Field of Classification Search
  CPC .......... G01P 15/125; G01P 2015/0814; B81B 2201/0235; B81B 2203/051
  See application file for complete search history.

(56) References Cited

U.S. PATENT DOCUMENTS

| 5,983,721 A | 11/1999 | Sulzberger et al. | |
|---|---|---|---|
| 7,322,242 B2 | 1/2008 | Merassi et al. | |
| 8,207,586 B2 | 6/2012 | Sato et al. | |
| 2002/0026830 A1* | 3/2002 | Otani | G01P 15/0888 73/514.32 |
| 2009/0282914 A1* | 11/2009 | Rehle | G01P 15/125 73/504.12 |
| 2009/0293617 A1* | 12/2009 | McNeil | B81B 3/0072 73/514.32 |
| 2010/0281980 A1* | 11/2010 | Yazawa | B81B 3/0078 73/514.32 |
| 2011/0049648 A1* | 3/2011 | Geisberger | B81C 1/00182 257/415 |

(Continued)

FOREIGN PATENT DOCUMENTS

| CN | 103364588 A | 10/2013 |
|---|---|---|
| JP | 2010-071911 A | 4/2010 |
| JP | 2010-071912 A | 4/2010 |

*Primary Examiner* — David Bolduc
(74) *Attorney, Agent, or Firm* — Harness, Dickey & Pierce, P.L.C.

(57) ABSTRACT

A physical quantity sensor includes a base substrate and an element piece bonded to the base substrate. The element piece includes fixed portions fixed to the base substrate, a first fixed electrode finger supported on the fixed portion, a second fixed electrode finger supported on the fixed portion, a fixed portion that is positioned between the fixed portions and is fixed to the base substrate, a movable portion that is displaceable with respect to the fixed portion, an elastic portion that links the fixed portion and the movable portion, a first movable electrode finger that is supported on the movable portion and that is arranged facing the first fixed electrode finger, and a second movable electrode finger that is supported on the movable portion and is arranged facing the second fixed electrode finger.

20 Claims, 9 Drawing Sheets

(56) References Cited

U.S. PATENT DOCUMENTS

| | | | |
|---|---|---|---|
| 2011/0083506 A1* | 4/2011 | Classen | B81B 3/0072 73/504.12 |
| 2011/0270569 A1* | 11/2011 | Stephanou | G01C 19/5712 702/141 |
| 2013/0192369 A1* | 8/2013 | Acar | G01C 19/5712 73/514.01 |
| 2013/0255382 A1 | 10/2013 | Tanaka | |
| 2014/0083190 A1* | 3/2014 | Kaack | G01P 15/125 73/514.14 |
| 2015/0075285 A1* | 3/2015 | Ariki | G01C 19/5733 73/514.32 |
| 2015/0143906 A1* | 5/2015 | Ogawa | G01C 19/5747 73/514.32 |

* cited by examiner

PHYSICAL QUANTITY SENSOR, PHYSICAL QUANTITY SENSOR DEVICE, ELECTRONIC APPARATUS, AND MOVING OBJECT

BACKGROUND

1. Technical Field

The present invention relates to a physical quantity sensor, a physical quantity sensor device, an electronic apparatus, and a moving object.

2. Related Art

JP-A-2010-71911 discloses a physical quantity sensor having a substrate and a surface-mounting structure bonded to the substrate. The surface-mounting structure includes an anchor bonding region for two fixed electrode fingers and an anchor bonding region for one movable electrode finger positioned on the left side, and an anchor bonding region for two fixed electrode fingers and an anchor bonding region for one movable electrode finger positioned on the right side, and further, a movable portion (center bar) is arranged between the anchor bonding regions divided into left and right.

In such a configuration, the movable portions interfere, and thus it is difficult to arrange all of the anchor bonding regions closely. Accordingly, for example, problems arise in which the influence of warping of the substrate due to thermal expansion becomes significant and the detection precision of acceleration is lowered.

SUMMARY

An advantage of some aspects of the invention is to provide a physical quantity sensor, a physical quantity sensor device, an electronic apparatus, and a moving object with superior detection precision of a physical quantity.

The invention can be realized in the following aspects or application examples.

APPLICATION EXAMPLE 1

According to this application example, there is provided a physical quantity sensor, including a substrate; and an element piece arranged on the substrate, in which the element piece includes a first fixed portion fixed to the substrate, a second fixed portion fixed to the substrate, a first fixed electrode finger that is supported on the first fixed portion, and that is positioned on the opposite side to the second fixed portion with respect to the first fixed portion, a second fixed electrode finger that is supported on the second fixed portion, and is positioned on the opposite side to the first fixed portion with respect to the second fixed portion, a third fixed portion that is positioned between the first fixed portion and the second fixed portion, and is fixed to the substrate, a movable portion able to displace with respect to the third fixed portion, an elastic portion that links the movable portion to the third fixed portion to be displaceable, and at least a portion of which is positioned between the first fixed electrode finger and the second fixed electrode finger, a first movable electrode finger that is supported by the movable portion and is arranged facing the first fixed electrode finger, and a second movable electrode finger that is supported by the movable portion and that is arranged facing the second fixed electrode finger.

In so doing, the first fixed portion, the second fixed portion, and the third fixed portion can be arranged close to one another, and, because the influence of warping of the substrate due to thermal expansion is reduced, the physical quantity sensor has superior detection precision of a physical quantity.

APPLICATION EXAMPLE 2

In the physical quantity sensor of the application example, it is preferable that the first fixed portion, the second fixed portion, and the third fixed portion are arranged along the vibration direction of the movable portion.

In so doing, the action of the rotation moment on the movable portion can be reduced.

APPLICATION EXAMPLE 3

In the physical quantity sensor of the application example, it is preferable that the movable portion is formed in a frame shape, and the first fixed portion, the second fixed portion, and the third fixed portion are arranged on the inside of the movable portion.

In so doing, size reductions can be achieved in the physical quantity sensor.

APPLICATION EXAMPLE 4

In the physical quantity sensor of the application example, it is preferable that the movable portion includes a first opposing portion arranged facing the first fixed electrode finger and a second opposing portion arranged facing the second fixed electrode finger.

In so doing, it is possible to use the first opposing portion as the first movable electrode finger, and to use the second opposing portion as the second movable electrode finger.

APPLICATION EXAMPLE 5

In the physical quantity sensor of application example, it is preferable that the first opposing portion is wider than the first movable electrode finger, and the second opposing portion is wider than the second movable electrode finger.

In so doing, the mechanical strength of the movable portion is improved.

APPLICATION EXAMPLE 6

In the physical quantity sensor of the application example, it is preferable that the movable portion includes a first part positioned between the elastic portion and the first fixed electrode finger, and a second part positioned between the elastic portion and the second fixed electrode finger.

In so doing, the mass of the movable portion can be increased without increasing the external shape of the movable portion.

APPLICATION EXAMPLE 7

According to this application example, there is provided a physical quantity sensor device including the physical quantity sensor of the above-described application examples and an electronic component electrically connected to the physical quantity sensor.

In so doing, a highly reliable physical quantity sensor device is obtained.

APPLICATION EXAMPLE 8

According to this application example, there is provided an electronic apparatus including the physical quantity sensor of the above-described application examples.

In so doing, a highly reliable electronic apparatus is obtained.

APPLICATION EXAMPLE 9

According to this application example, there is provided a moving object including the physical quantity sensor of the above-described application examples.

In so doing, a highly reliable moving object is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Below, the physical quantity sensor, the physical quantity sensor device, the electronic apparatus, and the moving object of the invention will be described in detail based on embodiments illustrated in the attached drawings.

First Embodiment

Figure 1:
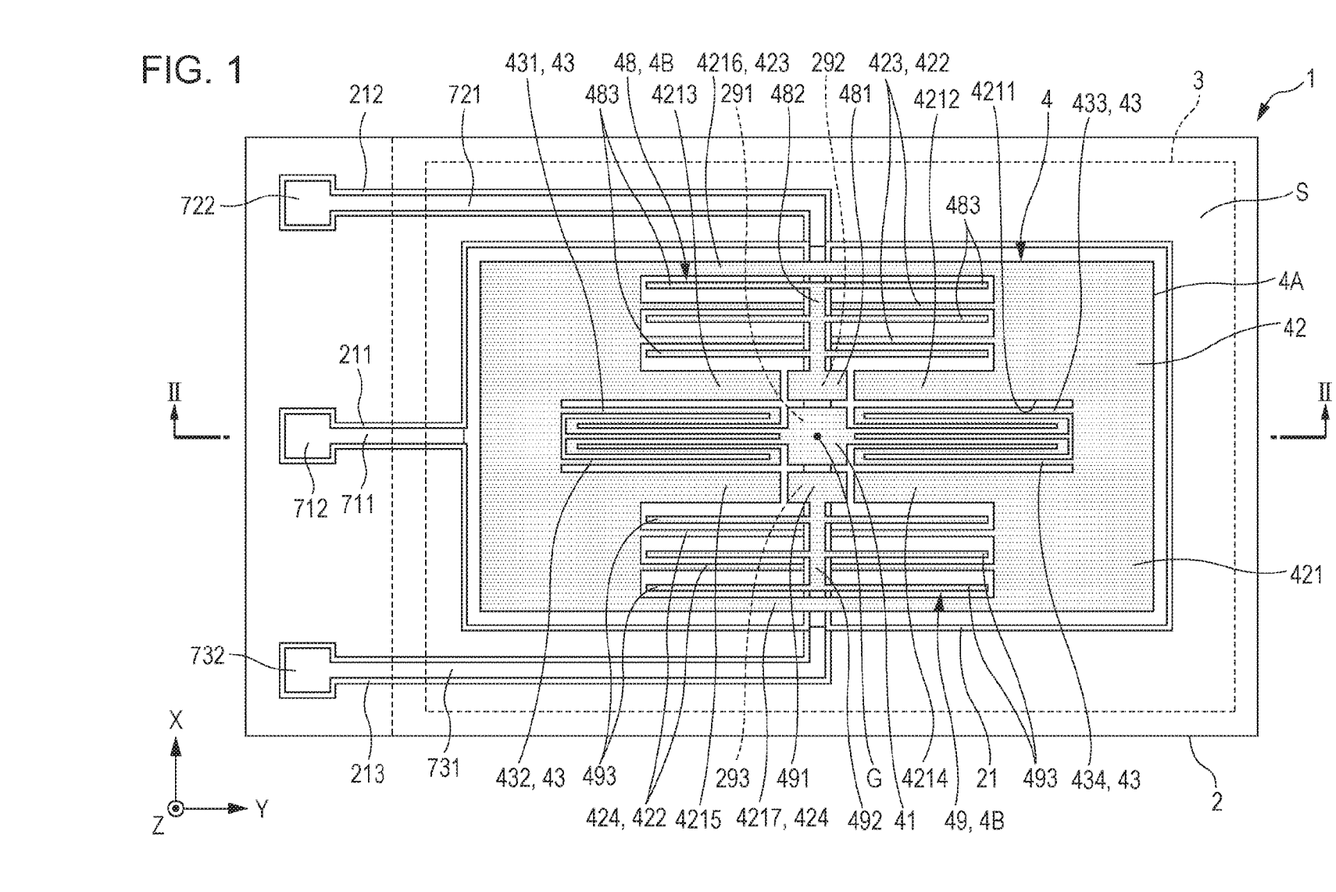
FIG. 1 is a plan view of a physical quantity sensor according to a first embodiment of the invention.
Figure 2:
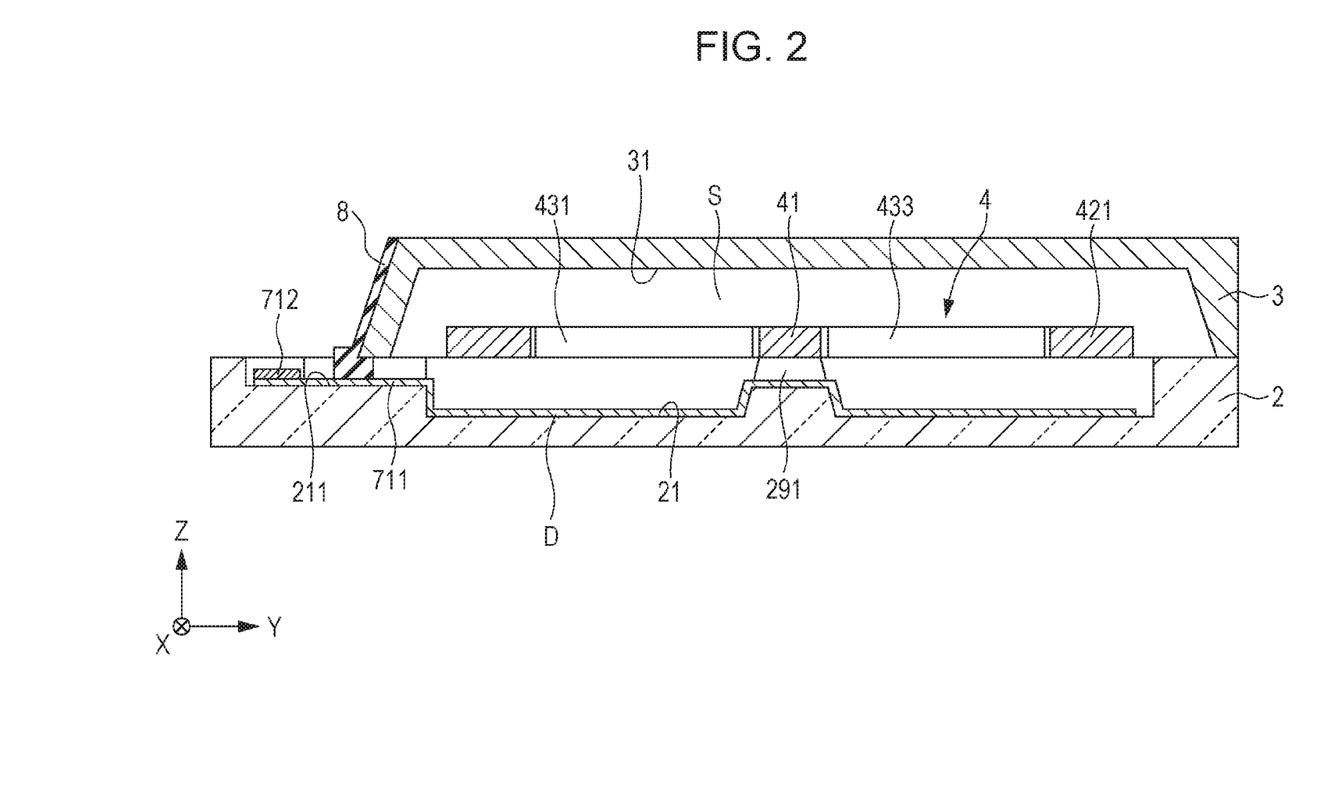
FIG. 2 is a cross-sectional view taken along the line II-II in FIG. 1.
Figure 3:
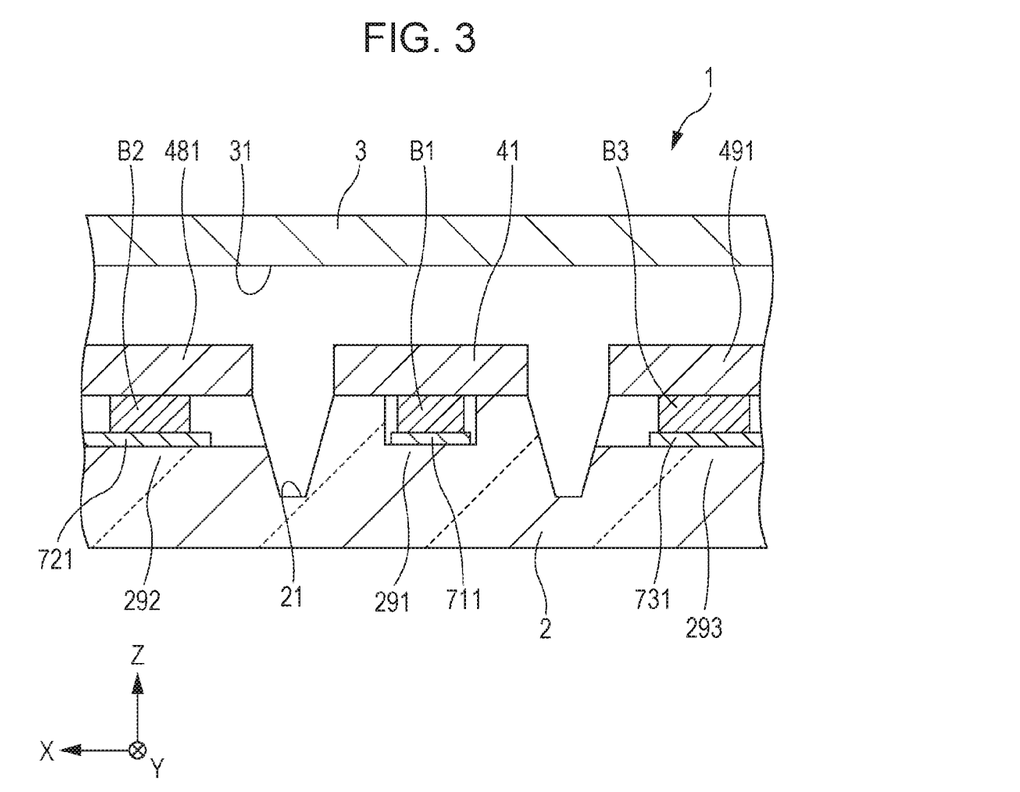
FIG. 3 is a cross-sectional view illustrating the bonding state of the element piece and the base substrate.
Figure 4:
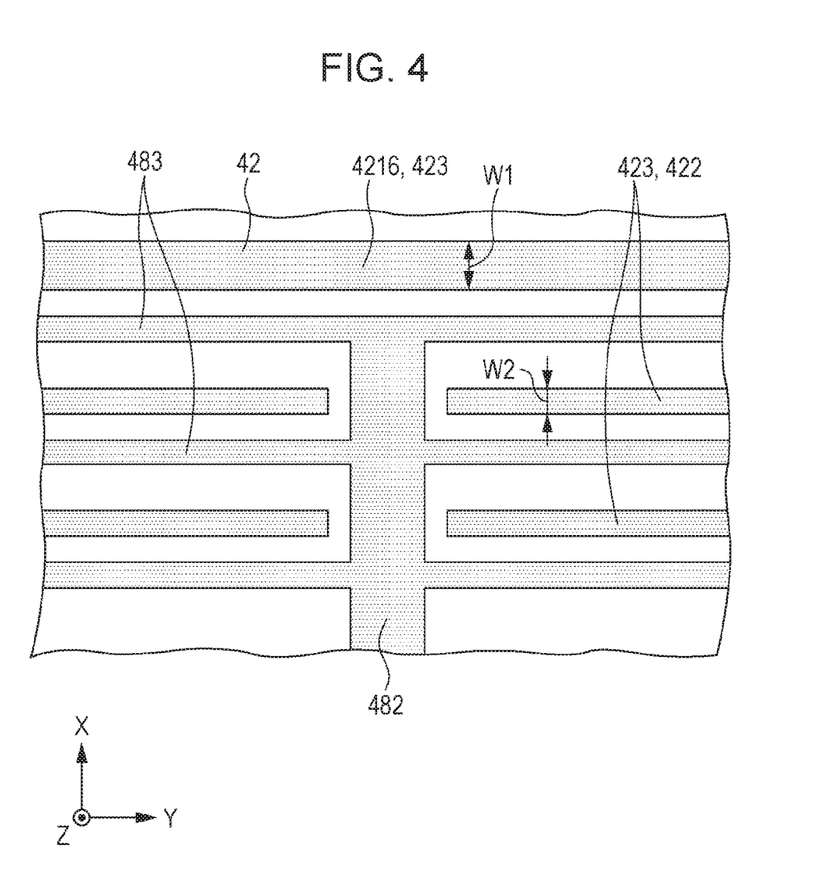
FIG. 4 is a partial expanded plan view illustrating the element piece.
Figure 5:
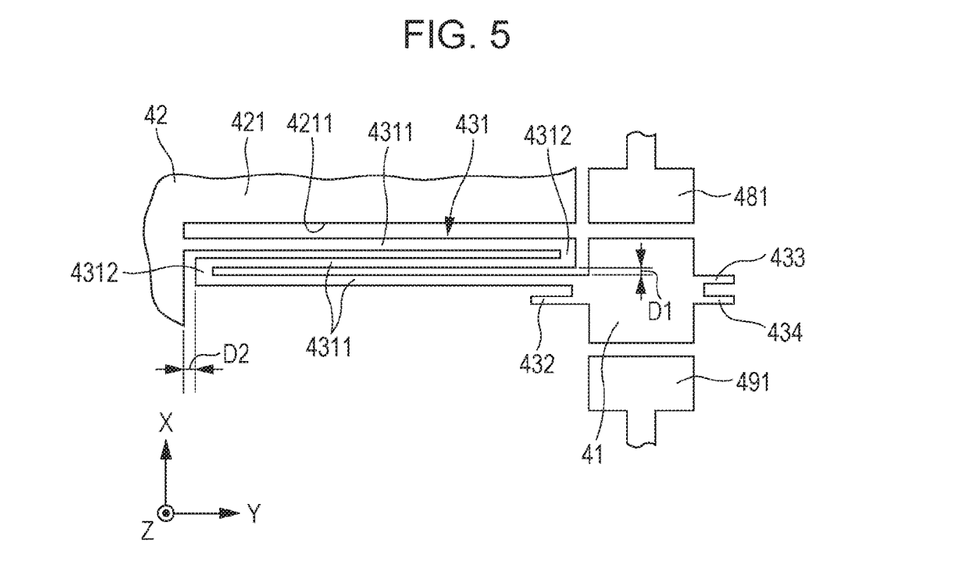
FIG. 5 is a partial expanded plan view illustrating an elastic portion included in the element piece.
Figure 6:
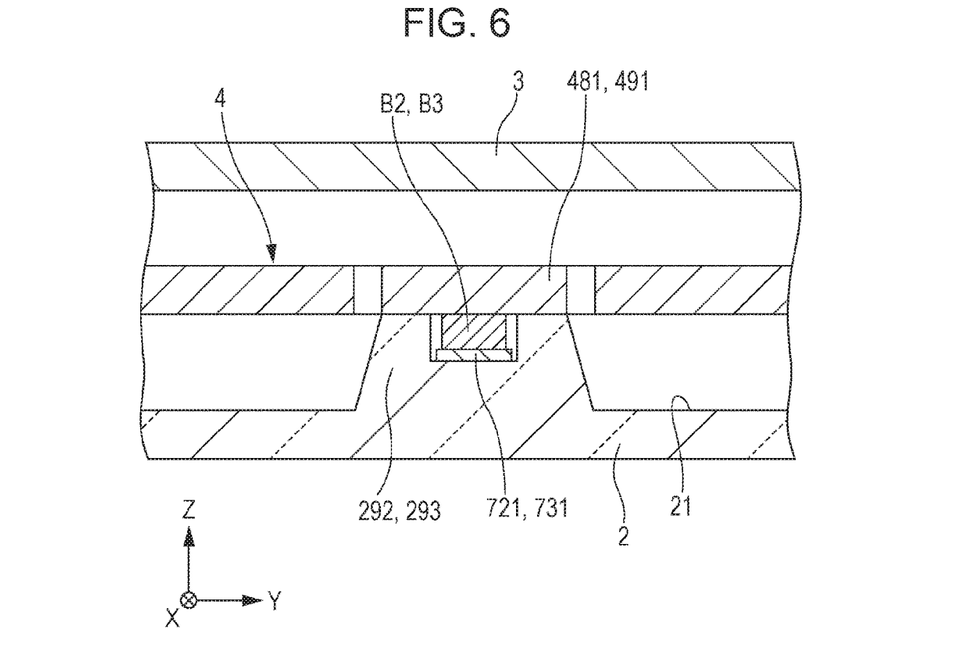
FIG. 6 is a cross-sectional view illustrating the bonding state of the element piece and the base substrate.
Figure 7:
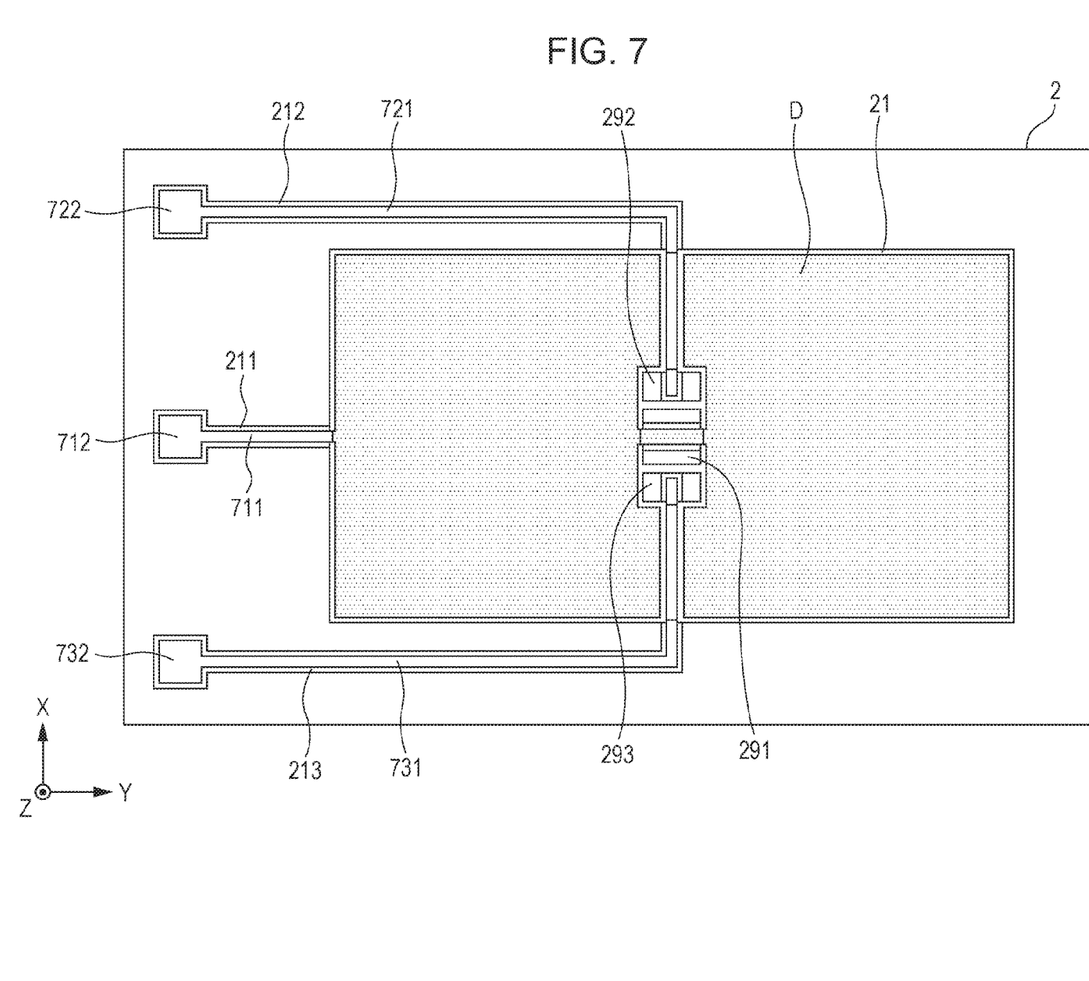
FIG. 7 is a plan view illustrating a wiring in the concave portion included in the base substrate.

FIG. 1 is a plan view of a physical quantity sensor according to the first embodiment of the invention. FIG. 2 is a cross-sectional view taken along the line II-II in FIG. 1. FIG. 3 is a cross-sectional view illustrating the bonding state of the element piece and the base substrate. FIG. 4 is a partial expanded plan view illustrating the element piece. FIG. 5 is a partial expanded plan view illustrating an elastic portion included in the element piece. FIG. 6 is a cross-sectional view illustrating the bonding state of the element piece and the base substrate. FIG. 7 is a plan view illustrating a wiring in the concave portion included in the base substrate.

Below, for ease of description, the sheet surface forward side in FIG. 1 (upper side in FIG. 2) will be referred to as "up" and the sheet surface interior side (lower side in FIG. 2) as "down". In each drawing, the X-axis, the Y-axis, and the Z-axis are depicted as three mutually orthogonal axes. Below, the direction parallel to the X-axis is also referred to as the "X-axis direction", the direction parallel to the Y-axis as the "Y-axis direction" and the direction parallel to the Z-axis as the "Z-axis direction". The plane that includes the X-axis and the Y-axis is also referred to as the "XY plane".

The physical quantity sensor 1 illustrated in FIGS. 1 and 2 is able to be used as an acceleration sensor for measuring acceleration in the X-axis direction (in-plane direction). Such a physical quantity sensor 1 includes a base substrate (substrate) 2, a lid 3, and an element piece 4 arranged in the internal space S formed by the base substrate and the lid. Such a physical quantity sensor 1 is configured so that, when acceleration is imparted in the X-axis direction, the electrostatic capacitances C1 and C2 formed in the element piece 4 changes and the imparted acceleration is detected based on this change in the electrostatic capacitances C1 and C2.

Below, the base substrate 2, the lid 3, and the element piece 4 will be described in this order.

Base Substrate

A concave portion 21 that opens to the upper surface is formed in the base substrate 2. The concave portion 21 functions as an escape portion for preventing contact between the element piece 4 and the base substrate 2. The base substrate 2 includes projections 291, 292, and 293 that protrude from the bottom surface of the concave portion 21 and that include a bonding surface with the element piece 4, as illustrated in FIG. 3. Concave portions 211, 212, and 213 that open to the upper surface and that are connected to the concave portion 21 are formed in the base substrate 2. A wiring 711 and a terminal 712 are formed in the concave portion 211, a wiring 721 and a terminal 722 are formed in the concave portion 212, and a wiring 731 and a terminal 732 are formed in the concave portion 213. Each terminal 712, 722, and 732 is arranged so as to be exposed from the lid 3 and is able to be electrically connected to the outside (for example, an IC chip 102, described later).

Such a base substrate 2 is formed from a glass material (for example, a borosilicate glass such as Pyrex glass (registered trademark)) that contains alkali metal ions (mobile ions). In so doing, it is possible for the element piece 4 formed from a silicon substrate to be strongly bonded to the base substrate 2 through an anode bonding. Here, the constituent material of the base substrate 2 is not limited to a glass material, and it is possible to use a high resistance silicon material. In this case, it is possible for bonding to the element piece 4 to be performed via a resin-based adhesive, a glass paste, a metal film or the like.

Element Piece

The element piece 4 is bonded to the base substrate 2. The element piece 4 includes a first structure 4A having a part displaceable with respect to the base substrate 2 and a second structure 4B, the position of which is fixed with respect to the base substrate 2. Such an element piece 4 is formed from a silicon substrate doped with impurities such as phosphorous or boron. Specifically, it is possible for the element piece 4 to be formed by, for example, bonding the silicon substrate doped in advance with impurities to the upper surface of the base substrate 2 through anode bonding, next thinning the silicon substrate, as necessary, by chemical mechanical polishing (CMP) or the like, and next patterning the silicon substrate using a photolithography method and an etching method. However, the constituent material of the element piece 4 is not limited to silicon, and it is possible to use another semiconductor or the like.

First, the first structure 4A will be described. The first structure 4A is provided with a fixed portion (third fixed portion) 41 fixed to the base substrate 2, a movable portion 42, and an elastic portion 43 that links the fixed portion 41 and the movable portion 42.

The fixed portion 41 is bonded and fixed to the upper surface of the projection 291 of the base substrate 2, as illustrated in FIG. 3. The fixed portion 41 is electrically connected to the wiring 711 via a conductive bump B1. The movable portion 42 is provided so as to surround the periphery of the fixed portion 41. The movable portion 42 includes a frame-like base portion 421 that surrounds the periphery of the fixed portion 41, and a plurality of movable electrode fingers 422 that extend from the base portion 421, as illustrated in FIG. 1.

The base portion 421 is formed in a frame shape that has an opening 4211. The movable electrode fingers 422 are provided so as to protrude in the opening 4211. The movable electrode fingers 422 include a plurality of first movable electrode fingers 423 that are positioned on one side (+X-axis side) with respect to the center G of the base portion 421, and a plurality of second movable electrode fingers 424 that are positioned on another side (−X-axis side). The first movable electrode fingers 423 are arranged to line up in the X-axis direction forming two rows in the Y-axis direction, and the second movable electrode fingers 424 are arranged to line up in the X-axis direction forming two rows in the Y-axis direction.

The base portion 421 include a first opposing portion 4216 that is positioned further to the +X-axis side (opposite side to the fixed portion 41) than the first movable electrode fingers 423 that protrude in the opening 4211, and that is arranged facing the first movable electrode fingers 423, and a second opposing portion 4217 that is positioned further to the −X-axis side (opposite side to the fixed portion 41) than the second movable electrode fingers 424, and is arranged facing the second movable electrode fingers 424. The first opposing portion 4216 serves as the first movable electrode finger 423, and the second opposing portion 4217 serves as the second movable electrode finger 424. In this way, it is possible to achieve size reductions in the first structure 4A by a portion of the base portion 421 serving as the movable electrode finger 422. As described below, it is possible to increase the electrostatic capacitance C1 formed between the second structure 4B.

In particular, in the embodiment, as illustrated in FIG. 4, the width (length in the X-axis direction) W1 of the first opposing portion 4216 is larger than the width (length in the X-axis direction) W2 of the other first movable electrode fingers 423. In this way, it is possible to increase the mechanical strength of the base portion 421 and it is possible to reduce bending or warping of the base portion 421 by satisfying the relationship W1>W2. A similar relationship is also satisfied for the width of the second opposing portion 4217 and the width of another second movable electrode finger 424. It is possible to increase the mechanical strength of the base portion 421 and possible to reduce bending or warping of the base portion 421 by satisfying this relationship.

Such a movable portion 42 is linked to the fixed portion 41 via the elastic portion 43. The elastic portion 43 is positioned between the base portion 421 and the fixed portion 41, and includes the first elastic portion 431, the second elastic portion 432, the third elastic portion 433, and the fourth elastic portion 434 that link the movable portion 42 and the fixed portion 41. The first to fourth elastic portions 431 and 434 have elasticity and are capable of elastic deformation in the X-axis direction. Therefore, it is possible for the movable portion 42 to displace in the X-axis direction with respect to the fixed portion 41 while causing the first to fourth elastic portions 431 to 434 to elastically deform.

When the elastic portion 43 is described in detail, the first and second elastic portions 431 and 432 are positioned on the Y-axis side with respect to the fixed portion 41 and the third and fourth elastic portions 433 and 434 are positioned on the +Y-axis side with respect to the fixed portion 41. The first and second elastic portions 431 and 432 are arranged to line up in the X-axis direction, and the third and fourth elastic portions 433 and 434 are arranged to line up in the X-axis direction. Each elastic portion 431 to 434 has a configuration that meanders in the X-axis direction while reciprocating in the Y-axis direction.

In particular, if the first elastic portion 431 from the elastic portions 431 to 434 is described as an example, as illustrated in FIG. 5, the first elastic portion 431 includes an extension portion 4311 that extends in the Y-axis direction, and a linking portion 4312 that links adjacent extension portions 4311 to one another, and the separation distance D1 between adjacent extension portions 4311 and the separation distance D2 between the linking portion (linking portion positioned on the −Y-axis side) 4312 and the base portion 421 (inner circumference of opening 4211) become substantially the same. In this way, by making the separation distances D1 and D2 substantially the same, it is possible to reduce overetching when forming the first elastic portion 431 by etching the silicon substrate and to precisely form the first elastic portion 431.

As long as the configuration of the elastic portion 43 is able to support the movable portion 42 to be displaceable in the X-axis direction, there is no limitation to the above-described configuration.

Next, the second structure 4B will be described. The second structure 4B, as illustrated in FIG. 1, includes a first fixed electrode portion 48 and a second fixed electrode portion 49 arranged on the inside (in the opening 4211) of the movable portion 42. In this way, it is possible to achieve size reductions in the physical quantity sensor 1 (in particular, suppress planar spreading) by arranging the first and second fixed electrode portions 48 and 49 on the inside of the movable portion 42.

The first fixed electrode portion 48 includes a fixed portion (first fixed portion) 481 bonded and fixed to the projection 292 of the base substrate 2, a support beam portion 482 that extends in the +X-axis direction from the fixed portion 481 passing between the first movable electrode fingers 423 lined up in the Y-axis direction, and a plurality of first fixed electrode fingers 483 that extend from the support beam portion 482 to both sides in the Y-axis direction.

The fixed portion 481 is positioned on the +X-axis side of the fixed portion 41, and is arranged to line up with the fixed portion 41. Here, as described above, because the support beam portion 482 and the first fixed electrode finger 483 are positioned on the opposite side to the fixed portion 41 with respect to the fixed portion 481, it is possible for the fixed portion 481 to be arranged closer to the fixed portion 41.

The fixed portion 481 is electrically connected to the wiring 721 via a conductive bump B2, as illustrated in FIG. 6. The wiring 721 is arranged facing the bottom surface of the concave portion 21 of the base substrate 2 so as to overlap the support beam portion 482. In so doing, for example, it is possible to reduce the formation of unnecessary electrostatic capacitance between the movable portion 42 and the wiring 721.

Each first fixed electrode finger 483 is lined up so as to have a pectinate form that meshes with the first movable electrode fingers 423 spaced with a gap, and an electrostatic capacitance C1 is formed between the facing first movable electrode fingers 423. In particular, as described above, because the first opposing portion 4216 included in the movable portion 42 serves as the first movable electrode finger 423 and is arranged facing the first fixed electrode finger 483, it is possible to also form an electrostatic capacitance between therebetween. Therefore, it is possible to further increase the sum total of the electrostatic capacitance C1 formed between the first movable electrode finger 423 and the first fixed electrode finger 483.

Meanwhile, the second fixed electrode portion 49 includes a fixed portion (second fixed portion) 491 bonded and fixed to the projection 293 of the base substrate 2, a support beam portion 492 that extends in the −X-axis direction from the fixed portion 491 passing between the second movable electrode fingers 424 lined up in the Y-axis direction, and a plurality of second fixed electrode fingers (second fixed electrodes) 493 that extend from the support beam portion 492 to both sides in the Y-axis direction.

The fixed portion 491 is positioned on the −X-axis side of the fixed portion 41 and is arranged to line up with the fixed portion 41. Here, as described above, because the support beam portion 492 and the second fixed electrode finger 493 are positioned on the opposite side to the fixed portion 41 with respect to the fixed portion 491, it is possible for the fixed portion 491 to be arranged closer to the fixed portion 41.

The fixed portion 491 is electrically connected to the wiring 731 via a conductive bump B3, as illustrated in FIG. 6. The wiring 731 is arranged facing the bottom surface of the concave portion 21 of the base substrate 2 so as to overlap the support beam portion 492. In so doing, for example, it is possible to reduce the formation of unnecessary electrostatic capacitance between the movable portion 42 and the wiring 731.

Each second fixed electrode finger 493 is lined up so as to have a pectinate form that meshes with the second movable electrode fingers 424 spaced with a gap, and an electrostatic capacitance C2 is formed between the facing second movable electrode fingers 424. In particular, as described above, because the second opposing portion 4217 included in the movable portion 42 serves as the second movable electrode finger 424 and is arranged facing the second fixed electrode finger 493, it is possible to also form an electrostatic capacitance between therebetween. Therefore, it is possible to further increase the sum total of the electrostatic capacitance C2 formed between the second movable electrode finger 424 and the second fixed electrode finger 493.

Here, as illustrated in FIG. 1, protrusions (first part) 4212 and 4213 that protrude in the opening 4211 and are positioned between the first and third elastic portions 431 and 433 and the first fixed electrode finger 483 are provided on the base portion 421 of the movable portion 42. Similarly, protrusions (second part) 4214 and 4215 that protrude in the opening 4211 and are positioned between the second and fourth elastic portions 432 and 434 and the second fixed electrode finger 493 are provided on the base portion 421. By including such protrusions 4212, 4213, 4214, and 4215, it is possible to increase the mass of the base portion 421 without increasing the outer shape of the base portion 421. Therefore, it is possible to further increase the weight effect of the movable portion 42, and the movable portion 42 is displaced with greater precision according to the magnitude of the acceleration.

As illustrated in FIG. 7, a dummy electrode D insulated from the wirings 721 and 731 is provided on the majority of the bottom surface of the concave portion 21 of the base substrate 2, and the dummy electrode D is electrically connected to the wiring 711. According to such a configuration, because it is possible to cover the majority of the bottom surface of the concave portion 21 with the dummy electrode D that has the same potential as the movable portion 42, it is possible to reduce the electrostatic force generated when the silicon substrate and the base substrate 2 that become the element piece 4 are anode bonded and it is possible to effectively suppress adhering (so-called "sticking") of the silicon substrate to the base substrate 2.

Lid

The lid 3, as illustrated in FIG. 2, includes a concave portion 31 that opens to the lower side, and is bonded to the base substrate 2 so as to form an interior space S with the concave portion 31 and the concave portion 21. In the embodiment, such a lid 3 is formed with a silicon substrate. In this way, it is possible for the lid 3 and the base substrate 2 to be bonded by anode bonding. In a state where the lid 3 is bonded only to the base substrate 2, the inside of the internal space S is communicated with via the concave portions 211, 212, and 213 formed in the base substrate 2. Therefore, in the embodiment, the concave portions 211, 212, and 213 are blocked by a $SiO_2$ film 8 formed by a CVD method or the like using tetraethoxysilane (TEOS), and the interior space S is air-tightly sealed.

The physical quantity sensor 1 with the above configuration detects acceleration as follows. That is, when an acceleration in the X-axis direction is imparted on the physical quantity sensor 1, the movable portion 42 is displaced in the X-axis direction while the elastic portions 43 is elastically deformed based on the magnitude of the acceleration. The gap between the first movable electrode fingers 423 and the first fixed electrode fingers 483 and the gap between the second movable electrode fingers 424 and the second fixed electrode fingers 493 each change according to such displacement, and the electrostatic capacitances C1 and C2 each change according to this displacement. Therefore, it is possible for the physical quantity sensor 1 to detect acceleration based on the changes in the electrostatic capacitances C1 and C2 (differential signal).

In the physical quantity sensor 1, as described above, because the fixed portions 41, 481, and 491 are arranged close to one another (as close as possible), there is less influence of warping of the base substrate 2 due to heat or external stress. Therefore, it is possible to reduce the changes in the gap between the first fixed electrode fingers 483 and the first movable electrode fingers 423 (gap between the second fixed electrode fingers 493 and the second movable electrode finger 424) and changes in the opposing areas of the first fixed electrode fingers 483 and the first movable electrode fingers 423 (opposing areas between the second fixed electrode fingers 493 and the second movable electrode fingers 424) according to the environmental temperature. As a result, it is possible to suppress fluctuations in the electrostatic capacitances C1 and C2 due to the temperature to be small (that is, it is possible to exhibit superior temperature characteristics), and the detection precision of acceleration is improved.

In the embodiment, the separation distance between the fixed portion 41 and the fixed portion 481, and the distance between the fixed portion 41 and the fixed portion 491 are designed to be substantially the same. Therefore, it is possible for the electrostatic capacitance formed between the fixed portion 41 and the fixed portion 481 and the electrostatic capacitance formed between the fixed portion 41 and the fixed portion 491 to become substantially the same, and to suppress the overall offset in the electrostatic capacitance to be small.

Furthermore, because the fixed portions 41, 481, and 491 are arranged to line up in the X-axis direction that is the same as the displacement direction of the movable portion 42, it is possible to reduce the action of the rotation movement around the Z-axis on the movable portion 42. Specifically, in a case where a shift arises in the separation distance between the fixed portion 41 and the fixed portion 481 and the separation distance between the fixed portion 41 and the fixed portion 491, and, accordingly, a shift arises in the electrostatic capacitance formed between the fixed portion 41 and the fixed portion 481 and the electrostatic capacitance formed between the fixed portion 41 and the fixed portion 491, as long as the fixed portions 41, 481 and 491 are lined up in the X-axis direction as in the embodiment, because the force generated caused by the shift in the electrostatic capacitance acts in the X-axis direction, the rotation moment around the Z-axis does not act when the movable portion 42 is driven to vibrate in the X-axis direction. In contrast, for example, in a case where the fixed portions 41, 481, and 491 are lined up in the Y-axis direction, because the force generated caused by the shift in electrostatic capacitance acts in the Y-axis direction, the rotation moment around the Z-axis may act when the movable portion 42 is driven to vibrate in the X-axis direction. In light of this reason, by arranging the fixed portions 41, 481, and 491 lined up in the X-axis direction, the rotation moment around the Z-axis less easily acts on the movable portion 42.

Second Embodiment

Next, the physical quantity sensor device according to the second embodiment of the invention will be described.

Figure 8:
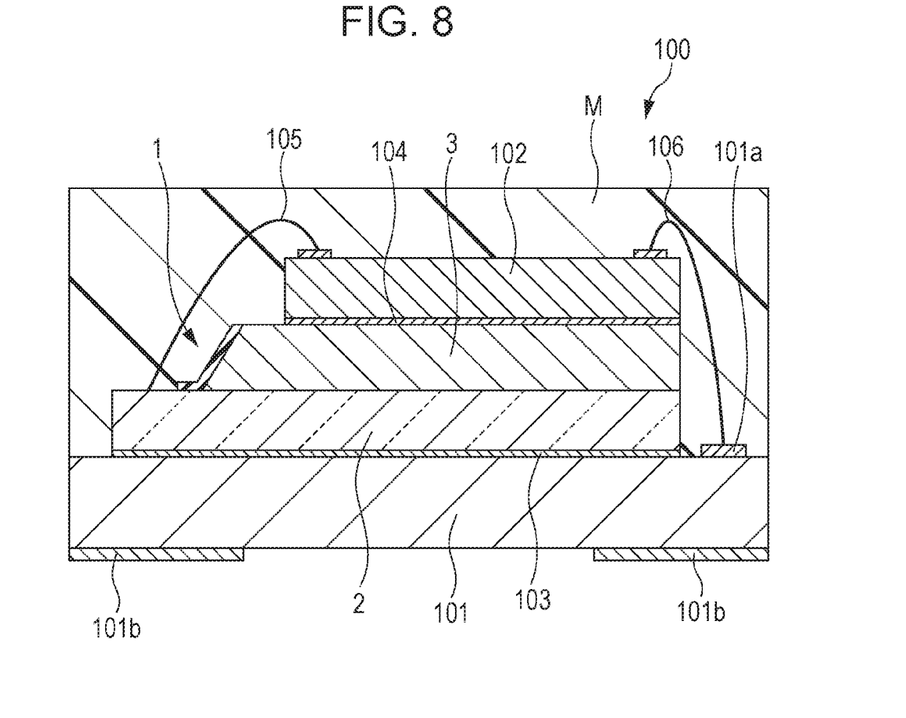
FIG. 8 is a cross-sectional view illustrating a physical quantity sensor device according to a second embodiment of the invention.

FIG. 8 is a cross-sectional view illustrating a physical quantity sensor device according to the second embodiment of the invention.

The physical quantity sensor device 100 illustrated in FIG. 8 includes a substrate 101, the physical quantity sensor 1 fixed to the upper surface of the substrate 101 via an adhesive layer 103, and an IC chip (electronic component) 102 fixed to the upper surface of the physical quantity sensor 1 via an adhesive layer 104. The physical quantity sensor 1 and the IC chip 102 are molded by a molding material M in a state where the lower surface of the substrate 101 is exposed. It is possible to use, for example, solder, a silver paste, a resin-based adhesive (die attach chemical) or the like as the adhesive layers 103 and 104. It is possible to use a heat-curable epoxy resin as the molding material M, and, for example, it is possible to perform molding with a transfer mold method.

A plurality of terminals 101a are arranged on the upper surface of the substrate 101, and a plurality of mounting terminals 101b connected to the terminals 101a via internal wirings or the like, not shown, are arranged on the lower surface. Although not particularly limited, it is possible to use a silicon substrate, a ceramic substrate, a resin substrate, a glass substrate, a glass epoxy substrate or the like as the substrate 101.

For example, a driving circuit for driving the physical quantity sensor 1, a detection circuit that detects the acceleration from the differential signal, an output circuit that outputs the signal from the detection circuit while converting to a predetermined signal, and the like are included in the IC chip 102. The IC chip 102 is electrically connected to the terminals 712, 722, and 732 of the physical quantity sensor 1 via a bonding wire 105, and electrically connected to the terminal 101a of the substrate 101 via a bonding wire 106.

Such a physical quantity sensor device 100 has superior reliability since the physical quantity sensor 1 is provided.

Third Embodiment

Next, an electronic apparatus according to the third embodiment of the invention will be described.

Figure 9:
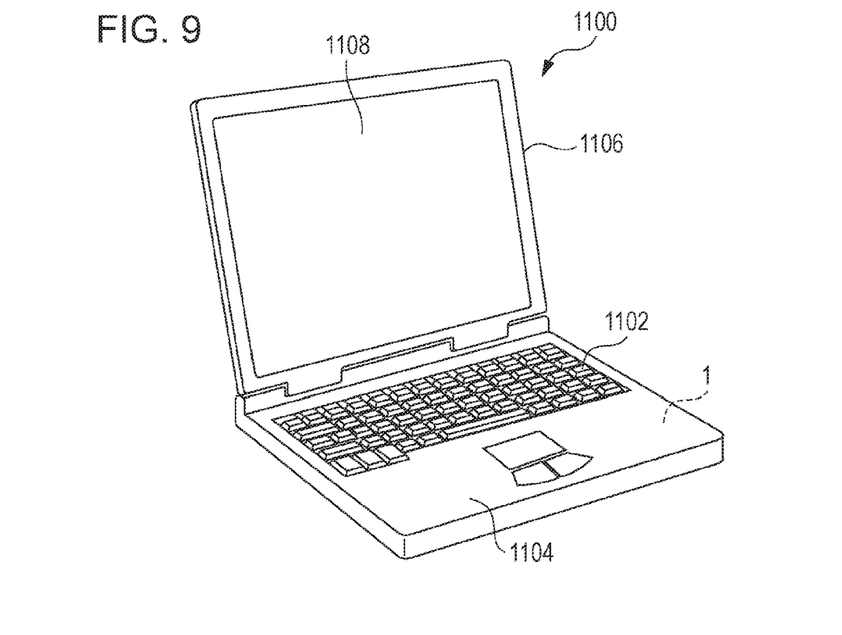
FIG. 9 is a perspective view illustrating a configuration of a mobile type (or a notebook-type) personal computer to which the electronic apparatus of the invention is applied.

FIG. 9 is a perspective view illustrating a configuration of a mobile type (or a notebook-type) personal computer to which the electronic apparatus of the invention is applied.

In the drawing, a personal computer 1100 is configured by a main body portion 1104 provided with a keyboard 1102, and a display unit 1106 provided with a display section 1108, and the display unit 1106 is supported to be able to rotate with respect to the main body portion 1104 via a hinge structure unit. The physical quantity sensor 1 that functions as an acceleration sensor is built into the personal computer 1100.

Figure 10:
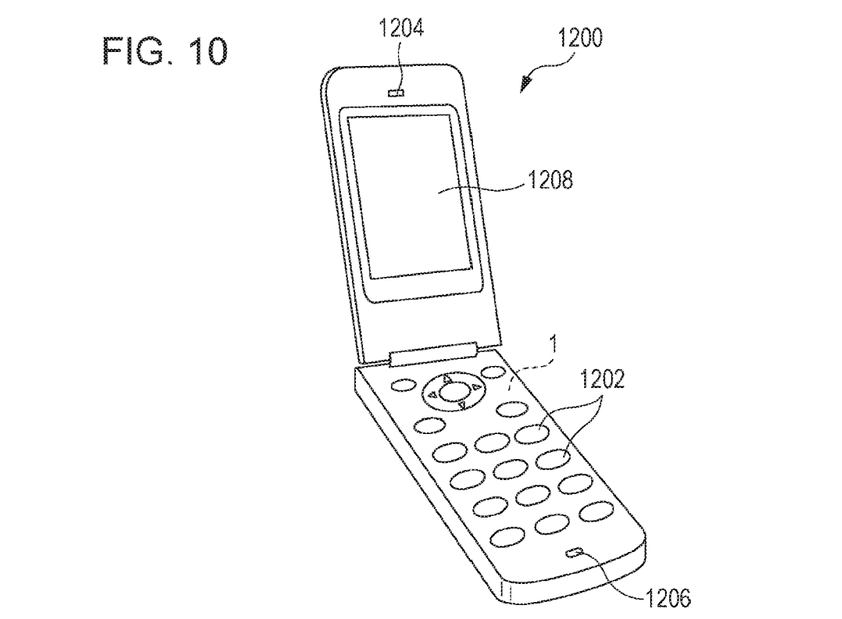
FIG. 10 is a perspective view illustrating a configuration of a mobile telephone (including a PHS) to which the electronic apparatus of the invention is applied.

FIG. 10 is a perspective view illustrating the configuration of a mobile telephone (including a PHS) to which the electronic apparatus of the invention is applied.

In the drawing, the mobile telephone 1200 is provided with an antenna (not shown), a plurality of operation buttons 1202, an ear piece 1204, and a mouthpiece 1206, and a display section 1208 is arranged between the operation buttons 1202 and the ear piece 1204. The physical quantity sensor 1 that functions as an acceleration sensor is built into the mobile telephone 1200.

Figure 11:
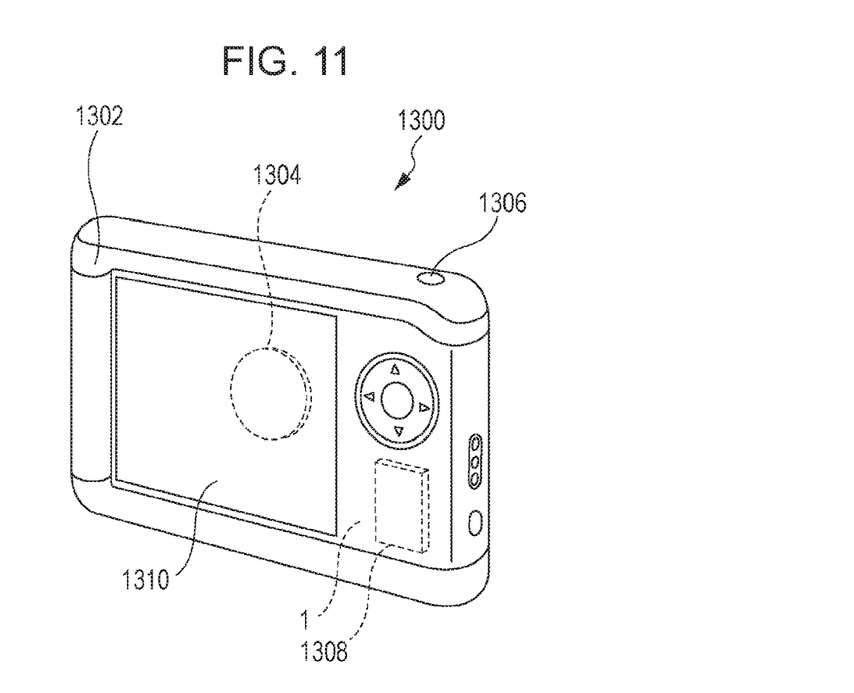
FIG. 11 is a perspective view illustrating a configuration of a digital still camera to which the electronic apparatus of the invention is applied.

FIG. 11 is a perspective view illustrating a configuration of a digital still camera to which the electronic apparatus of the invention is applied.

A display section 1310 is provided on the rear surface of the case (body) 1302 of the digital still camera 1300 and is configured to perform display based on the imaging signal by the CCD, and the display section 1310 functions as a viewfinder that displays a subject as an electronic image. A light receiving unit 1304 that includes an optical lens (imaging optical system), CCD or the like is provided on the front surface side (in the drawing, rear surface side) of the case 1302. The photographer verifies the subject image displayed on the display section 1310, and when the shutter button 1306 is depressed, the imaging signal of the CCD at this point in time is transferred to and stored in the memory 1308. The physical quantity sensor 1 used as an acceleration sensor in hand shake correction is built into the digital still camera 1300.

Such an electronic apparatus has superior reliability since the physical quantity sensor 1 is provided.

It is possible for the electronic apparatus of the invention to be applied to smartphones, tablet terminals, timepieces, ink jet discharge devices (for example, an ink jet printer), laptop-type personal computers, televisions, video cameras, video tape recorders, car navigation systems, pagers, electronic organizers (including those with a communication function), electronic dictionaries, calculators, electronic game machines, word processors, workstations, videophones, television monitors for security, electronic binoculars, POS terminals, medical equipment (for example, electronic thermometers, blood pressure monitors, blood glucose meters, electrocardiograph devices, ultrasonic diagnostic devices, and endoscopic display devices), fishfinders, various measurement apparatuses, meters, (for example, instruments for vehicles, aircraft, and ships), and flight simulators and the like, in addition to the personal computer (mobile personal computer) in FIG. 9, the mobile telephone in FIG. 10, and the digital still camera in FIG. 11.

Fourth Embodiment

Next, a moving object according to the fourth embodiment of the invention will be described.

Figure 12:
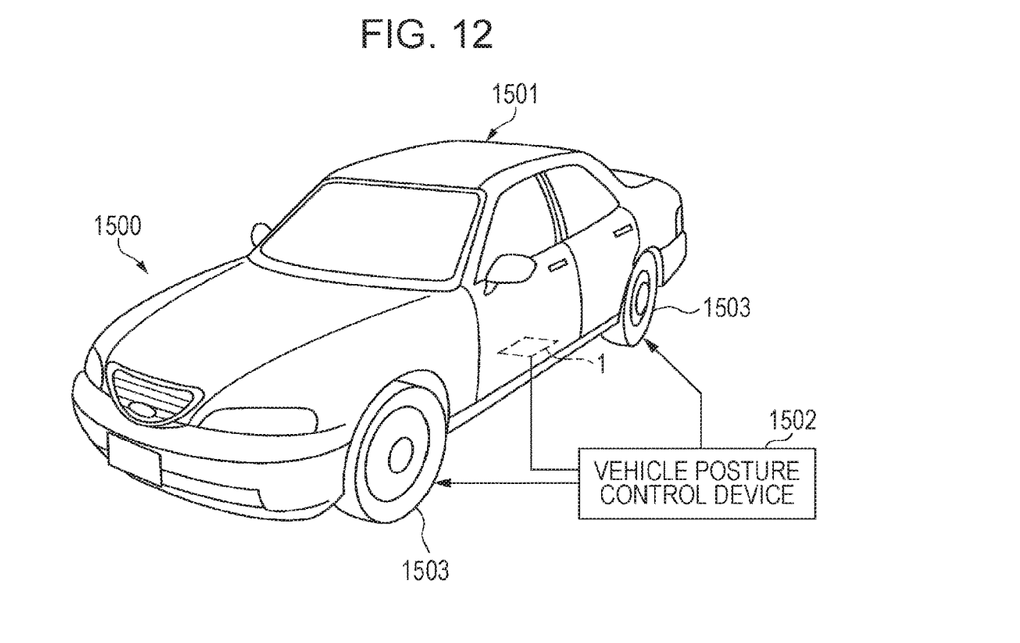
FIG. 12 is a perspective view illustrating an automobile to which the moving object of the invention is applied.

FIG. 12 is a perspective view illustrating an automobile to which the moving object of the invention is applied.

As illustrated in FIG. 12, the physical quantity sensor 1 is built into the automobile 1500 and, for example, it is possible to detect the posture of the wheel 1501 with the physical quantity sensor 1. The detection signal of the physical quantity sensor 1 is supplied to the wheel posture control device 1502, the wheel posture control device 1502 detects the posture of the wheel 1501 based on the signal, and it is possible to control the softness of the suspension according to the detection results or to control the braking of the individual wheels 1503. It is possible additionally to widely apply the physical quantity sensor 1 to an electronic control units (ECU) such as keyless entry, an immobilizer, a car navigation system, car air conditioning, an anti-lock braking system (ABS), an air bag, a tire pressure monitoring system (TPMS), an engine controller, and a battery monitor for a hybrid automobile or an electric automobile.

Although the physical quantity sensor, physical quantity sensor device, electronic apparatus, and moving object of the invention were described above based on the embodiments of the drawings; the invention is not limited thereto and it is possible for the configuration of each part to be substituted with an arbitrary configuration having the same function. Other arbitrary configurations may be added to the invention.

In the above-described embodiment, although a configuration in which the physical quantity sensor includes an element piece that detects acceleration in the X-axis direction was described, the physical quantity sensor may include an element piece that detects acceleration in the Y-axis direction. In this case, the arrangement of the element piece of the above-described embodiment may be rotated 90 degrees.

In the above-described embodiment, although a configuration in which the physical quantity sensor includes one element piece in the internal space, the number of element pieces arranged in the internal space is not limited thereto. For example, two of the above-described element pieces may be arranged in order to detect acceleration on the X-axis and the Y-axis. A further element piece for detecting acceleration on the Z-axis may be arranged. In so doing, a physical quantity sensor is formed that is able to detect acceleration on a plurality of axes. It is possible for the physical quantity sensor to be used as a composite sensor that is able to detect acceleration and angular velocity by further adding element pieces that are able to detect angular velocity.

The entire disclosure of Japanese Patent Application No: 2015-138475, filed Jul. 10, 2015 is expressly incorporated by reference herein.

What is claimed is:

1. A physical quantity sensor, comprising:
a substrate; and
an element piece arranged on the substrate,
wherein the element piece includes:
a first fixed portion fixed to the substrate,
a second fixed portion fixed to the substrate,
a first fixed electrode finger that is supported on the first fixed portion, the first fixed electrode finger being positioned on an opposite side of the first fixed portion from the second fixed portion,
a second fixed electrode finger that is supported on the second fixed portion, the second fixed electrode finger being positioned on an opposite side of the second fixed portion from the first fixed portion,
a third fixed portion that is positioned between the first fixed portion and the second fixed portion, and is fixed to the substrate,
a movable portion able to displace with respect to the third fixed portion,
an elastic portion that links the movable portion to the third fixed portion to be displaceable, and at least a portion of which is positioned between the first fixed electrode finger and the second fixed electrode finger,
a first movable electrode finger that is supported by the movable portion and is arranged facing the first fixed electrode finger, and
a second movable electrode finger that is supported by the movable portion and that is arranged facing the second fixed electrode finger.

2. The physical quantity sensor according to claim 1,
wherein the first fixed portion, the second fixed portion, and the third fixed portion are arranged along the vibration direction of the movable portion.

3. The physical quantity sensor according to claim 2,
wherein the movable portion is formed in a frame shape, and
the first fixed portion, the second fixed portion, and the third fixed portion are arranged on the inside of the movable portion.

4. The physical quantity sensor according to claim 3,
wherein the movable portion includes a first opposing portion arranged facing the first fixed electrode finger and a second opposing portion arranged facing the second fixed electrode finger.

5. The physical quantity sensor according to claim 4,
wherein the first opposing portion is wider than the first movable electrode finger, and
the second opposing portion is wider than the second movable electrode finger.

6. The physical quantity sensor according to claim 1,
wherein the movable portion includes a first part positioned between the elastic portion and the first fixed electrode finger, and a second part positioned between the elastic portion and the second fixed electrode finger.

7. A physical quantity sensor device, comprising:
the physical quantity sensor according to claim 1; and
an electronic component electrically connected to the physical quantity sensor.

8. A physical quantity sensor device, comprising:
the physical quantity sensor according to claim 2; and
an electronic component electrically connected to the physical quantity sensor.

9. A physical quantity sensor device, comprising:
the physical quantity sensor according to claim 3; and
an electronic component electrically connected to the physical quantity sensor.

10. A physical quantity sensor device, comprising:
the physical quantity sensor according to claim 4; and
an electronic component electrically connected to the physical quantity sensor.

11. A physical quantity sensor device, comprising:
the physical quantity sensor according to claim 5; and
an electronic component electrically connected to the physical quantity sensor.

12. A physical quantity sensor device, comprising:
the physical quantity sensor according to claim 6; and
an electronic component electrically connected to the physical quantity sensor.

13. An electronic apparatus, comprising:
the physical quantity sensor according to claim 1.

14. An electronic apparatus, comprising:
the physical quantity sensor according to claim 2.

15. An electronic apparatus, comprising:
the physical quantity sensor according to claim 3.

16. An electronic apparatus, comprising:
the physical quantity sensor according to claim 4.

17. A vehicle, comprising:
the physical quantity sensor according to claim 1.

18. The physical quantity sensor according to claim 2, wherein the movable portion includes a first part positioned between the elastic portion and the first fixed electrode finger, and a second part positioned between the elastic portion and the second fixed electrode finger.

19. The physical quantity sensor according to claim 3, wherein the movable portion includes a first part positioned between the elastic portion and the first fixed electrode finger, and a second part positioned between the elastic portion and the second fixed electrode finger.

20. The physical quantity sensor according to claim 4, wherein the movable portion includes a first part positioned between the elastic portion and the first fixed electrode finger, and a second part positioned between the elastic portion and the second fixed electrode finger.

\* \* \* \* \*